United States Patent

Takizawa et al.

[19]

[11] Patent Number: 6,118,273
[45] Date of Patent: Sep. 12, 2000

[54] MAGNETIC RESONANCE IMAGING METHOD AND DEVICE THEREFOR

[75] Inventors: Masahiro Takizawa, Kashiwa; Tetsuhiko Takahashi, Soka, both of Japan

[73] Assignee: Hitachi Medical Corporation, Tokyo, Japan

[21] Appl. No.: 09/149,121

[22] Filed: Sep. 9, 1998

[30] Foreign Application Priority Data

Oct. 17, 1997 [JP] Japan ................................. 9-284945

[51] Int. Cl.$^7$ ........................................ G01V 3/00
[52] U.S. Cl. ....................... 324/309; 324/318; 600/410
[58] Field of Search .................................. 324/309, 312, 324/318, 300; 600/410

[56] References Cited

U.S. PATENT DOCUMENTS

| | | | |
|---|---|---|---|
| 4,684,891 | 8/1987 | Feinberg | 324/309 |
| 4,889,127 | 12/1989 | Takeda et al. | 128/653 |
| 5,270,654 | 12/1993 | Feinberg et al. | 324/309 |
| 5,382,902 | 1/1995 | Taniguchi et al. | 324/309 |
| 5,521,505 | 5/1996 | Kohno | 324/309 |
| 5,545,993 | 8/1996 | Taguchi et al. | 324/309 |
| 5,668,474 | 9/1997 | Heid | 324/309 |
| 5,800,354 | 9/1998 | Hofland et al. | 600/410 |

*Primary Examiner*—Christine K. Oda
*Assistant Examiner*—Brij B. Shrivastav
*Attorney, Agent, or Firm*—Antonelli, Terry, Stout & Kraus, LLP

[57] ABSTRACT

In a magnetic resonance imaging method in which after irradiating RF pulses of magnetic resonance frequencies into an object to be inspected, a sequence of detecting echo signals sequentially and a step of reconstructing an image by making use of the obtained echo signals are repeated in parallel, and an animating image is obtained by successively renewing a part of the echo signals used for reconstructing the previous image, a navigator echo is generated for every irradiation of the RF pulses and is detected, a navigator echo which serves as a reference for correcting phases of the echo signals used for the image reconstruction is successively renewed for every image, and the phases of the echo signals are corrected based on the renewed navigator echo for every image obtain the same. Thereby, a reference time for correcting object motion by making use of navigator echoes (3021, 3022) is set short and artifacts due to an object motion is reduced with an accuracy corresponding to a high temporal resolution. Thus, an MRI method which permits reduction of artifacts due to object motions while keeping a high temporal resolution for an MRI of animating images is provided.

14 Claims, 4 Drawing Sheets

MAGNETIC RESONANCE IMAGING METHOD AND DEVICE THEREFOR

BACKGROUND OF THE INVENTION

1. Field of the Invention

The present invention relates to a magnetic resonance imaging method (hereinbelow referred to as MRI method) in a magnetic resonance imaging (MRI) device and a device therefor in which nuclear magnetic resonance (hereinbelow referred to as NMR) signals from such as hydrogens and phosphoruses in an object to be inspected are measured, and such as a nuclear density distribution and a relaxation time distribution therein are imaged, and, in particular, relates to an MRI method and a device therefor which eliminate artifacts due to an object motion, while keeping a high temporal resolution for animating images.

2. Conventional Art

In such fields as multi-shot echo planar imaging (multi-shot EPI) and three dimensional (3D) EPI, a navigation echo method for reducing artifacts due to object motions, which are caused in images because of motions of an object to be inspected between shots, has been known, for example, as described in Seong-Gi Kim et al. "Fast Interleaved Echo-Planar Imaging with Navigator: High Resolution Anatomic and Functional Images at 4 Tesla" (Magnetic Resonance in Medicine, 35: 895–902, June 1996).

A navigator echo is, for example, generated by applying a gradient magnetic field pulse for generating the navigator echo between a RF pulse 201 and a series of echo signal train obtaining routine 211 in a multi-shot EPI sequence as illustrated in FIG. 4. Such sequence is most particularly illustrated in FIG. 6. Wherein one navigator echo 3021 and 3022 is introduced for every RF pulse 2011 and 2012 irradiation. While assuming that no positional fluctuation of an object to be inspected occurs within a predetermined repetition time 209 or 304, motion of the object to be inspected is estimated based on a change between one navigator echo obtained in one repetition time (TR) and another navigator echo obtained in a subsequent repetition time (TR).

As illustrated, for example, in FIG. 7, when repeating a repetitive unit measurement 304 each including one navigator echo for obtaining one piece of image, four times in a unit 305 a navigator echo in a first measurement (illustrated in the drawing in gray) corresponding to shot number 1 is used as a reference and a necessary correction with regard to an object motion is carried out for the data of corresponding actual measurements (207 in FIG. 4) based on the changes of the navigator echoes in the following three time unit measurements 304 (shot numbers 2–4) to thereby obtain one piece of image 6011.

On the other hand, in order to obtain a magnetic resonance (hereinbelow called as MR) animating image, an MR fluoroscopy is known as one of applications of multi-shot EPI. Such MR fluoroscopy is illustrated in FIG. 5 in which from the beginning of measurement to the end thereof repetitive unit measurements 209 are time to time continued to obtain echo signal trains, and a predetermined number of new echo signal trains which are necessary for reconstructing one piece of image are used while counting back from the latest measurement, For example, in FIG. 5 echo signals obtained in four times of unit measurements are used, to reconstruct images for respective moments.

Even in such MR fluoroscopy, artifacts due to an object motion between shots are problematic. However, no MR fluoroscopy, to which a navigation echo method is applied, has been proposed.

In order to correct such an object motion it is conceivable to combine the above mentioned MR fluoroscopy and the navigation echo method. However, if both methods are simply combined, when reconstructing pieces of images 5011~5017 while successively shifting data for respective image reconstruction by one unit measurement 304, a navigator echo in a predetermined repetitive unit measurement having a fixed shot number among four repetitive unit measurements having respective shot numbers is used as a reference of phase correction for respective images, example, a navigator echo in the first repetitive unit measurement (as illustrated in gray in the drawing) is used as illustrated in FIG. 8.

In this instance, pieces of image 5011~5017 are renewed for every repetition time TR of the unit measurement 304. However, the navigator echo used as a reference is renewed for every four unit measurements counting from the first unit measurement 304 (the renewal timings A, B and C are illustrated in gray in the drawing), Therefore, a reference interval for the object motion correction making use of such navigator echo is prolonged to four times of the repetition time (4TR), and thus, notwithstanding a high apparent temporal resolution corresponding to the image renewal interval TR, a sudden change in an animating image is caused for every fourth image and the realtime characteristic thereof is deteriorated.

SUMMARY OF THE INVENTION

Accordingly, an object of the present invention is to provide an MRI method and a device therefor which permits an object motion correction while keeping a high temporal resolution in animating images, and reduces artifacts correspondingly depending on such a high temporal resolution.

In a magnetic resonance imaging method and a device therefor in which after irradiating RF pulses of magnetic resonance frequencies into an object to be inspected, a sequence of detecting echo signals sequentially and a step of reconstructing an image by making use of the obtained echo signals are repeated in parallel, and subsequent images are obtained by successively renewing a part of the echo signals used for reconstructing the previous image, the MRI method and the device therefor according to the present invention is characterized in that, a navigator echo is generated for every irradiation of the RF pulses and is detected, a navigator echo which serves as a reference for correcting phases of the echo signals used for the image reconstruction is successively renewed for every image, and the phases of the echo signals are corrected based on the renewed navigator echo for every image.

Through the successive renewal of the reference navigator echo, the reference interval for the object motion correction is matched with a renewal interval of consecutive images, thereby an object motion correction is performed while keeping a high temporal resolution of images.

The MRI method and device according to the present invention is desirably applied to a method and device where data of images are obtained from echo signal trains which are acquired by repeating a plurality of irradiations of RF pulses, namely, a multi-shot sequence, and can reduce artifacts due to object motion caused between shots.

In the present invention, at least one navigator echo having a zero phase encoding amount is desirably generated additionally for every RF pulse. For the object motion correction, phase differences between a reference navigator echo and other navigator echoes generated and obtained in connection with respective RF pulses are used for correcting phases of the obtained echo signals, thereby artifacts due to object motion are substantially removed.

Further, the navigator echo is primarily introduced to monitor motions of an object to be inspected with respect to an axis of the navigator echo. Therefore, if another navigator echo having different axis is obtained, the object motion in plural directions can be monitored.

DETAILED DESCRIPTION OF THE EMBODIMENTS

Hereinbelow, the MRI method and the device therefor according to the present invention are explained with reference to the drawings.

Figure 3:
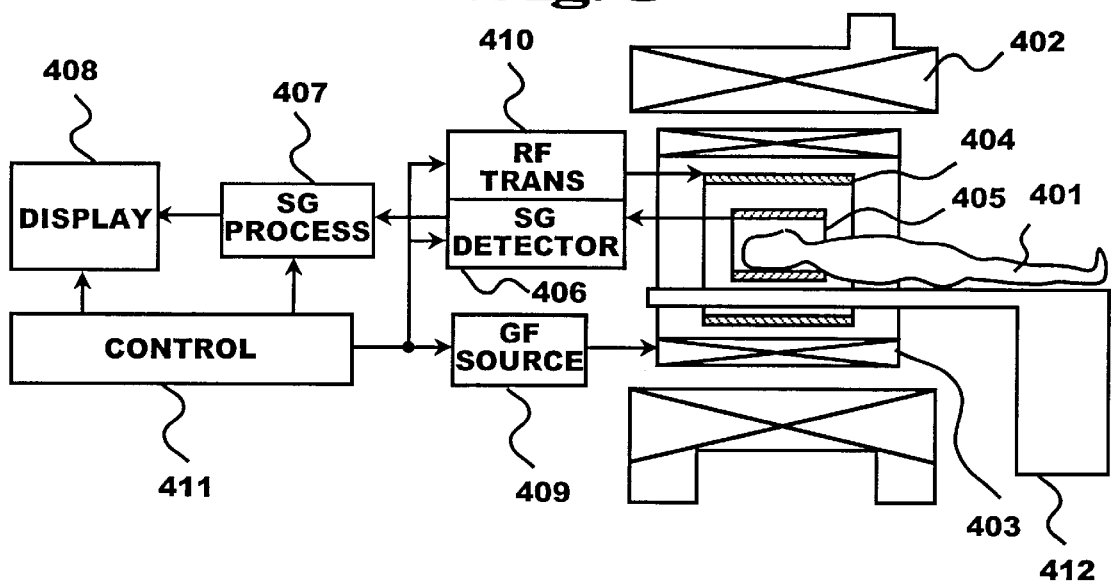
FIG. 3 is a block diagram of an MRI device with which MRI methods according to the present invention are carried out.

FIG. 3 shows a schematic constitution of a typical MRI device to which the present invention is applied. The MRI device is provided with a magnet 402 which is designed to generate a static magnetic field around an object 401 to be inspected, a gradient magnetic field coil 403 which is designed to generate a gradient magnetic field in the space of the static magnetic field, an RF coil 404 which is designed to generate a high frequency magnetic field in the magnetic field region and an RF probe 405 which is designed to detect MR signals generated from the object 401 to be inspected. A bed 412 is for laying the object 401 to be inspected thereon.

The gradient magnetic field coil 403 is constituted by gradient field coil units in three axial directions crossing perpendicularly each other and generates respective gradient magnetic fields in response to signals from a gradient magnetic field source 409. With these three axial direction gradient magnetic field coil units 403, three axial direction gradient magnetic fields including slicing direction, phase encoding direction and reading out direction are applied to the space where the object 401 to be inspected is laid. Further, it is not always necessary to match the application axes of the gradient magnetic fields with x, y and z axes of the gradient magnetic field coil units 403.

The RF coil 404 generates a high frequency magnetic field in a pulse form in response to signals from an RF transmitter unit 410. Signals from the RF probe 405 are detected by a signal detection unit 406, and are signal-processed at a signal processing unit 407 or are through calculation converted into image signals. Images are displayed at a display unit 408. The gradient magnetic field source 409, the RF transmitter unit 410 and the signal detection unit 406 are controlled by a control unit 411, and its control time chart is generally referred to as a pulse sequence, and in the present invention a pulse sequence for forming animating images is carried out.

Figure 6:
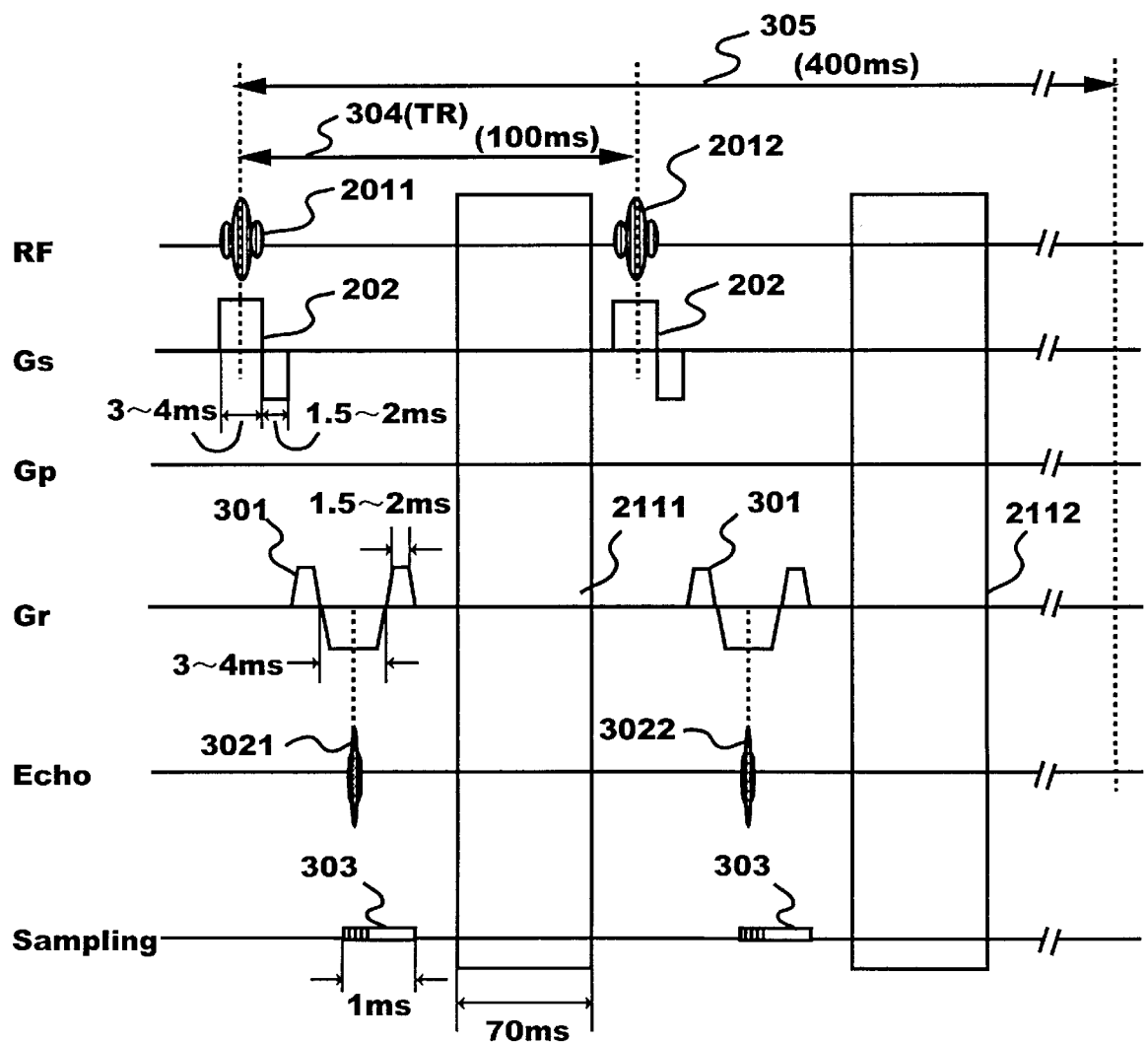
FIG. 6 is a view for explaining a navigation echo method which is applied to the MRI methods according to the present invention as well as conventional MRI methods.
Figure 7:
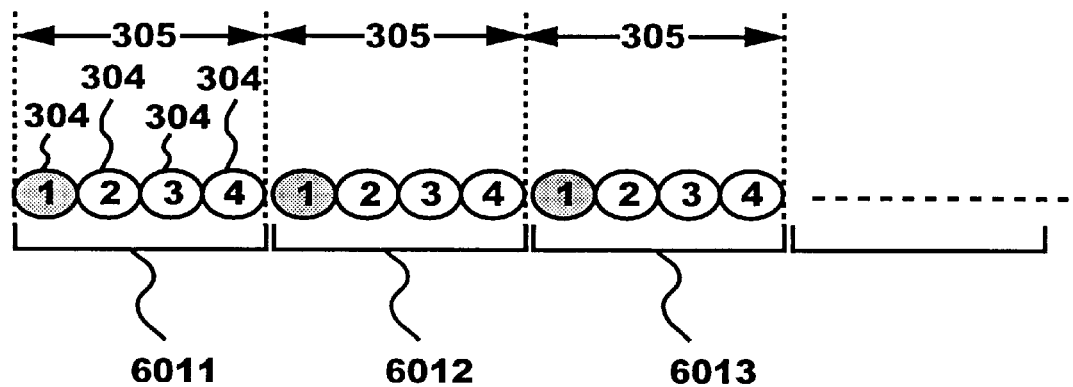
FIG. 7 is a view for explaining a conventional navigation echo method.
Figure 8:
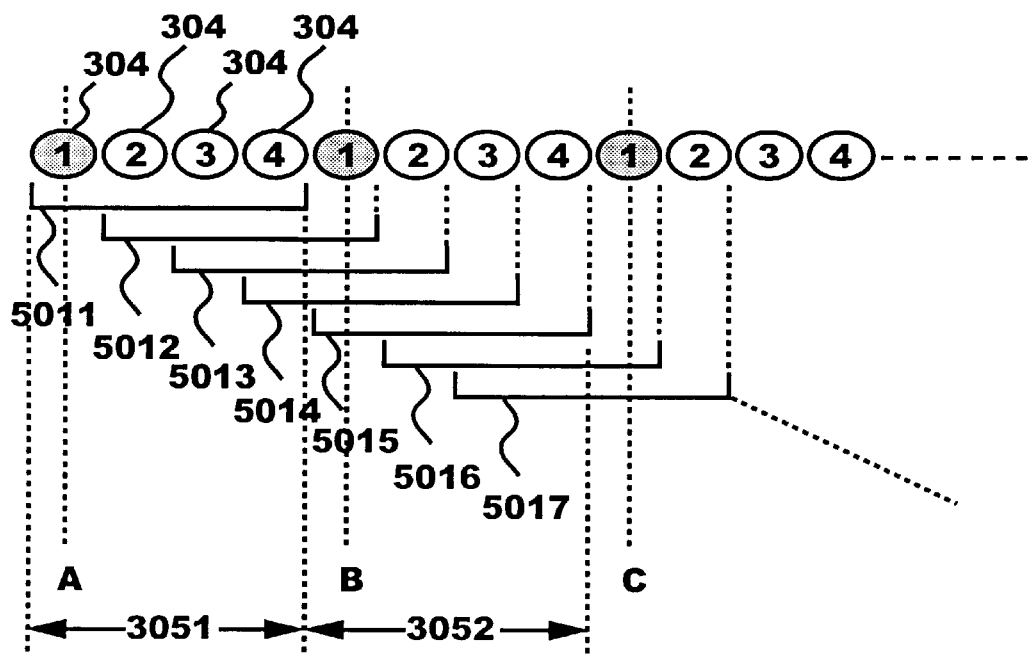
FIG. 8 is a view for explaining an example of conceivable MRI methods when an MR fluoroscopy and a navigation echo method are simply combined.

Now, an MR fluoroscopy which is employed for the MRI method according to the present invention is explained with reference to FIG. 1. In order to obtain animated images it is necessary to successively repeat image pick-ups, and a plurality (P times) of image pick-ups 1021, 1022, 1023 ... is carried out in an entire image pick-ups time 103. Each image pick-ups operation respectively consist of a multi-shot sequence as illustrated in FIG. 6, and, in the present example, a multi-shot of four shots EPI is employed and in each image pick-ups operation four times of measurements 1011~1014 corresponding to respective shots are performed, for which shot numbers 1–4 are respective assigned in the drawing. One piece of image is reconstructed by the echo signals obtained in the four times of measurements.

A first piece of image 1041 is produced by making use of echoes contained in a group of shot numbers 1–4 which are obtained at the time of image pick-ups 1021. A second piece of image 1042 is produced by making use of a group of echo signals in which echo signals of shot number 1 in the first image picking-up 1021 is renewed by echo signals of shot number 1 obtained in the subsequent image pick-ups 1022. A third piece of image 1043 is likely produced by making use of a group of echo signals in which echo signals of shot number 2 in the first image pick-ups 1021 is renewed by echo signals of shot number 2 in the subsequent image pick-ups 1022. In the like manner as above, images are produced by renewing echo signals obtained in the previous shot with echo signals having the same shot number in the new image pick-ups, in other words, by successively renewing a part of the echo train groups. Thereby, animated images are obtained of an interval corresponding to the measurement repetition time TR.

When there occurs object motion between shots, artifacts are caused in the animated images thus obtained. Therefore, in the imaging method according to the present invention, a step is introduced in which a navigator echo is generated and detected in every measurement 1011~1014 corresponding to respective shots of RF pulses, and with these navigator echo, phases of echo signals in respective echo trains are corrected which are used for reconstructing respective images.

The pulse sequence including navigator echoes is prepared by adding a sequence of generating navigator echoes to a multi-shot sequence, in that as illustrated in FIG. 6, at first an RF pulse 2011 is irradiated at the same time with the application of a slicing gradient magnetic field Gs 202, and subsequently, a gradient magnetic field Gr 301 for generating a navigator echo is applied. When the positive and negative application amount of the gradient magnetic field 301 is made equal, a navigator echo 3021 is generated which is sampled during a time span 303 to obtain data expanding along the time axis. The phase encoding amount of the navigator echo is zero, because no phase encoding gradient magnetic field is applied thereto.

Figure 4:
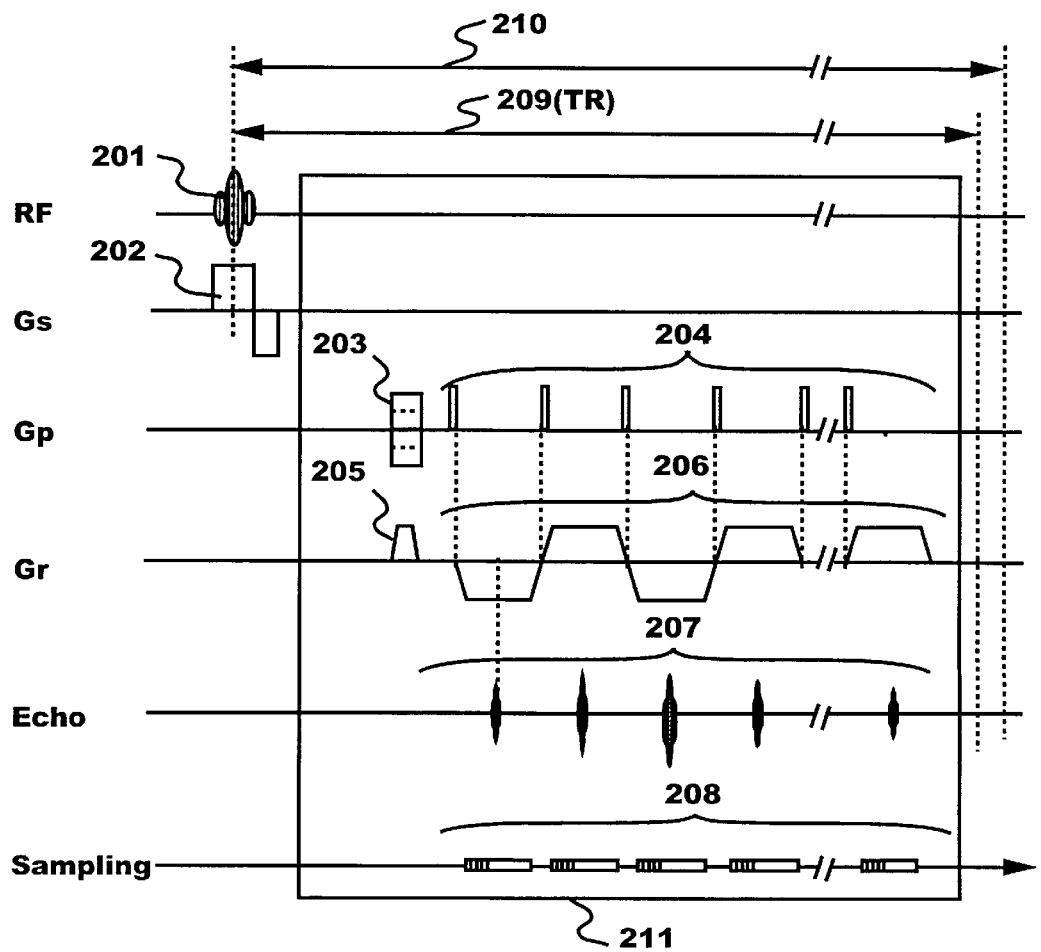
FIG. 4 is a pulse sequence chart of a multi-shot EPI which is applied to the MRI methods according to the present invention as well as conventional MRI methods.
Figure 5:
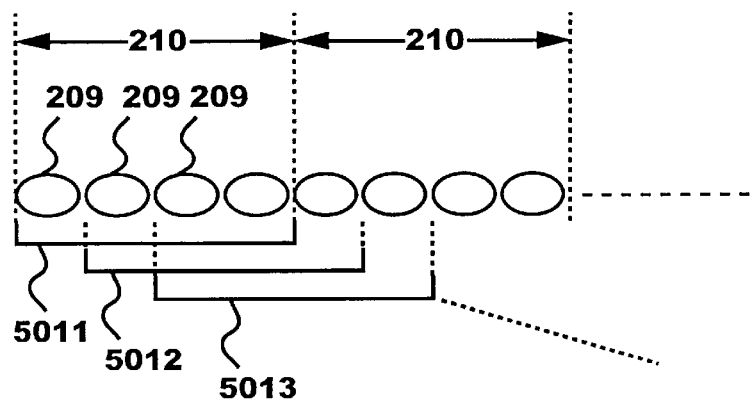
FIG. 5 is a view for explaining a conventional MR fluoroscopy.

Portions 2111 and 2112 in FIG. 6 surrounded by solid lines corresponds to a process 211 in the multi-shot EPI sequence shown in FIG. 4, wherein an offset reading out gradient magnetic field Gr 205 as well as a gradient magnetic field Gp 203 which provides an offset to the phase encoding amount are applied, and subsequently a readout gradient magnetic field Gr 206 which successively alternates and a phase encoding gradient magnetic field Gp 204 in synchronism therewith are applied. Within the respective period of the alternating readout gradient magnetic field Gr 206 echo signals 207 of respective phase encodes are generated sequentially, which are respectively sampled during respective time spans 208 to obtain data expanding along the time axis.

A sequence including the RF pulse irradiation and the process 2111 is repeated with the repetition time TR 304 while varying the offset amount of the phase encoding gradient magnetic field Gp 203 until completing measurement of echo signals of the entire phase encoding amount. For example, assuming that the encoding amount (KY) in the phase encoding direction is 256 and the number of echo signals (number of echo signals M in an echo train) measured in connection with one RF pulse irradiation is 64, a multi-shot EPI having sequence shot number N (number of repetitions) of 4 is established. In this instance, a data point number (KX) in the readout direction is selected, for example, to be 256.

Figure 1:
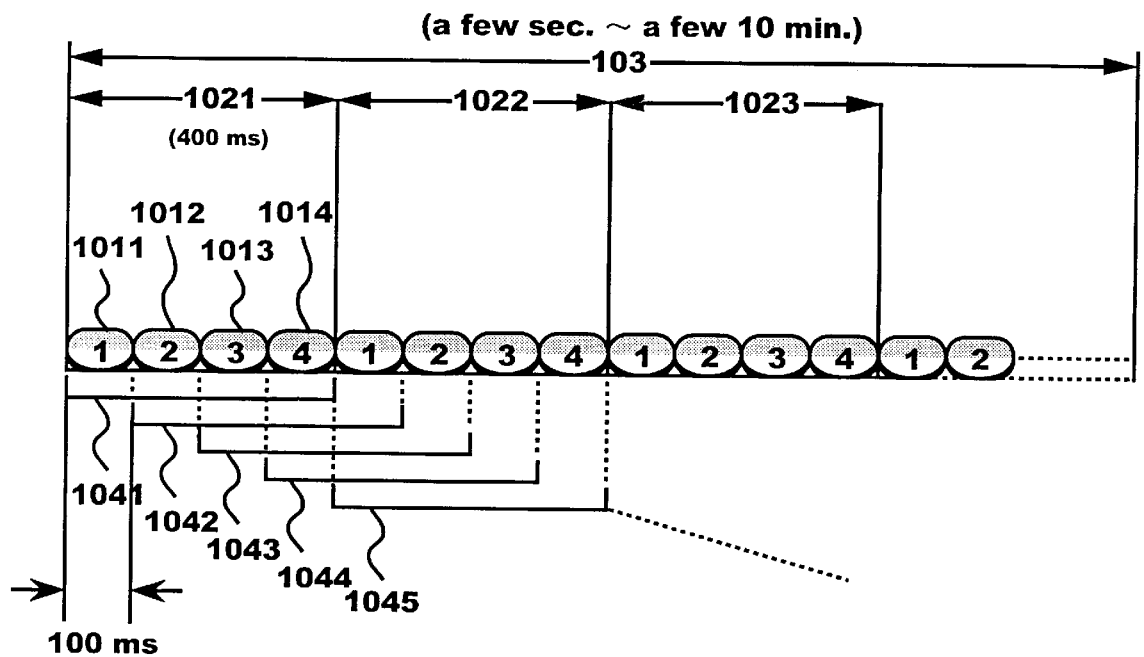
FIG. 1 is a view for explaining one embodiment of MRI methods according to the present invention.

When applying the above pulse sequence to the MR fluoroscopy as illustrated in FIG. 1, a number of navigator echoes corresponding to shot number (N)×image pick-ups number P is obtained. Each of the navigator echoes is expressed as V(kx, pn), wherein kx represents the data point number in the readout direction and satisfies the inequality of $1 \leq kx \leq KX$, and pn represents a navigator echo obtained at nth shot in pth image pick-ups and satisfies the inequalities $1 \leq p \leq P$ and $1 \leq n \leq N$. For example, mth ($1 \leq m \leq M$) echo signal S obtained at the nth shot in pth image pick-ups is expressed as S(kx, pn, m) and of which object motion is corrected based on the phase information of the corresponding navigator echo V(kx, pn) (having the same pn as the echo signals).

Now, a method of correcting object motion which makes use of the thus obtained navigator echoes, in other words, a process of correcting phases of respective echo signals S(kx, pn, m) is explained.

An important feature of the MRI method according to the present invention is that a reference navigator echo for determining phase information for respective other navigator echoes is not fixed to one having a specific shot number and is successively shifted. Namely, navigator echoes of respective shots serve at one instance as object motion monitoring navigator echoes and serve at another instance as a reference navigator echo. In FIG. 1, upper halves of the respective shots are illustrated in gray and the lower halves are in white which indicates that respective navigator echoes can serve as a reference as well as a monitor.

In the present embodiment, in order to reflect the position of the object to be inspected during the image pick-ups on the images to be obtained, an example is explained wherein a navigator echo in the oldest (most previous) shot among a group of measurements used for an image reconstruction is used as a reference navigator echo. In this instance a reference navigator echo for the first piece of image 1041 is expressed as V(kx, 11) (p=1, n=1) and based on this reference navigator echo object motion on the echo signals obtained in the measurements 1012~1014 is corrected, and further, a reference navigator echo for the second piece of image 1042 is expressed as V(kx, 12) (p=1, n=2). In this manner, a reference navigator echo is successively renewed, Therefore, the reference interval for correcting object motion is renewed for every repetition time TR, In other words, for every repetitive unit measurement interval and further, in the present embodiment, for every image renewal interval, thereby an object motion correction with an accuracy corresponding to the improved temporal resolution is carried out, whereby artifacts due to the object motion is reduced and desirable images can be obtained.

Although several methods can be employed for correcting object motion, a method in which phase differences between a reference navigator echo and other object motion monitoring navigator echoes are directly determined and the phases of the corresponding echo signals are corrected based on the thus determined phase differences, namely, a phase correction method in which phase differences are determined by making use of data of k space of navigator echoes and the phase correction of the echo signals is performed in k space is explained hereinbelow.

Now, when assuming that a reference navigator echo is V(kx, 1), and respective other navigator echoes of which phase differences are determined with reference to the reference navigator echo are V(kx, n), the phase differences $\theta$ is, for example, determined through the following calculations. Although, the ordinal numbers p of image pick-ups in V(kx, 1) and V(kx, n) do not necessarily match each other, the symbols corresponding to the ordinal numbers of image pick-ups are omitted in the followings for simplifying the explanation.

At first, with the following calculations, a phase shift map C(kx, n) expressed by a real portion and an imaginary portion of both navigator echo signals, is determined.

$$re[C(kx, n)] = re[V(kx, n)] \times re[V(kx, 1)]/|V(kx, 1)| + im[V(kx, n)] \times im[V(kx, 1)]/|V(kx, 1)|$$

$$im[C(kx, n)] = im[V(kx, n)] \times re[V(kx, 1)]/|V(kx, 1)| - re[V(kx, n)] \times im[V(kx, 1)]/|V(kx, 1)|$$

(wherein re[ ] represents a real portion of a signal, im[ ] represents an imaginary portion of the signal and represents | | an absolute value of the signal)

Phase difference $\theta$ for the nth shot is determined by making use of C(kx, n) as follows;

$$\theta(kx, n) = \tan^{-1}(im[C(kx, n)]/re[C(kx, n)])$$

The phase differences $\theta$ are determined for every data point number (kx; time axis) in the readout direction.

Although the phase differences of echo signals S are corrected based on these determined phase differences $\theta$, the phase differences $\theta$ as determined through the above calculations contain phase variations rotating around a principal value and noises. Therefore, it is preferable to apply a processing of correcting such phase variations and noises contained in the phase differences $\theta$ prior to using the same for the phase correction of the echo signal (kx, n, m).

At first, in order to remove such phase variations rotating around a principal value, the following processing is performed, in that, when $$|\theta(kx, n) - \theta(kx-1, n)| > A \text{ and}$$

$$|\theta(kx, n) - \theta(kx+1, n)| > A \text{ (wherein A is a constant) } \theta(kx, n) = (\theta(kx-1, n) + \theta(kx+1, n))/2$$

Although noises in the phase differences $\theta$, of which phase variations rotating around a principle value are removed, is decreased, the phase differences still contain some noise components which disturb calculation for the phase shift amount thereof. These noise components can be suppressed, for example, through a Median filter, a ButterWorth filter and a filtering processing such as a local averaging processing to thereby obtain a general or nonlocal variation of phase shift.

Further, in order to approximate the filtering processed phase differences to an ideal phase around a principal value, the phase differences for entire time phase (−kx, +kx) or a part of the time phase are subjected to a function fitting, for example, a linear function such as y=ax+b (wherein a and b are constants).

A real portion and an imaginary portion of a corrected phase shift map C'(kx, n) by making use of the phase differences θ of which phase variation rotating round a principle value and noise components are removed, are determined as follows;

re [C'(kx, n)]=Cos[θ(kx, n)]

im [C'(kx, n)]=Sin[θ(kx, n)]

By making use of thus corrected phase shift map C'(kx, n) echo signals S(kx, n, m) are corrected, and echo signals S'(kx, n, m) of which phase shift are corrected are obtained. The phase shift correction is performed for all of echo signals S(kx, n, m) having the same kx and n as those in the correct phase shift map C'(kx, n) according to the following calculation.

re[S'(kx, n, m)]=re[S(kx, n, m)]×re[C'(kx, n)]/|C'(kx, n)|+im[S(kx, n, m)]×im[C'(kx, n)]/|C'(kx, n)| im[S'(kx, n, m)]=im[S(kx, n, m)]×re[C'(kx, n)]/|C'(kx, n)|−re[S(kx, n, m)]×im[C'(kx, n)]/|C'(kx, n)|

Through reconstruction of images by making use of the thus phase shift corrected echo signals S'(kx, n, m), even if an object to be inspected moves during the time when performing a group of measurements necessary for obtaining one piece of image, the phase variations due to the motion can be corrected and images with no artifacts due to object motion can be obtained. The method according to the present embodiment is particularly effective for a case where the object to be inspected undergoes a large motion over more than one pixel.

The images are thus reconstructed with such object motion correction processing while renewing the reference navigator echo for every image to be reconstructed.

In the above embodiment, an example, wherein a navigator echo in the earliest echo train, in other words the oldest echo train, is used as the reference navigator echo, was explained. However, any navigator echo which was obtained in any one of four measurements used for reconstructing one piece of image can be used as the reference navigator echo.

Further, in the above embodiment an application of the phase correction method in which phase differences are determined by making use of data of k space of navigator echoes and the phase correction of the echo signals is performed in k space is explained. However, methods of phase correction using navigator echoes applicable to the present invention are not limited to one as applied to the above embodiment. Conventional object motion correcting methods in which phase differences are determined from navigator echo signals after Fourier-transformation can be applied. For example, a method, in which navigator echoes are Fourier-transformed, phase differences between respective Fourier-transformed navigator echoes are determined, and the phases of echo signals Fourier-transformed on the same axis as the Fourier-transformed navigator echoes are corrected in an image space, can be applied, which method consumes time because of the large number of times of the Fourier transformations, However such method is capable of correcting precisely a small object motion, and therefore, is, in particular, effective for a sequence such as diffusion imaging in which even a very small motion will cause artifacts.

Further, another phase correction method, in which profiles are determined by Fourier-transforming navigator echoes, phase differences of navigator echoes are determined based on a correlation of the profile positional shiftings between respective Fourier-transformed navigator echoes, and the phases of the corresponding echo signals are corrected in k space, can be also applied.

Further, methods of MR fluoroscopy which are applicable to the present invention are not limited to one explained in connection with the above embodiment, and several modifications can be acceptable. For example, a method of MR fluoroscopy as disclosed in JP-A-6-343621(1994) can be applied to the present invention, in which method, echo signal measurement order is controlled in such a manner that among a plurality of measured echo signals necessary for reconstructing one piece of image, only predetermined measured echo signals having a specific phase information (for example, data of a low spatial frequency region) are completely replaced for every reconstruction of images.

Figure 2A:
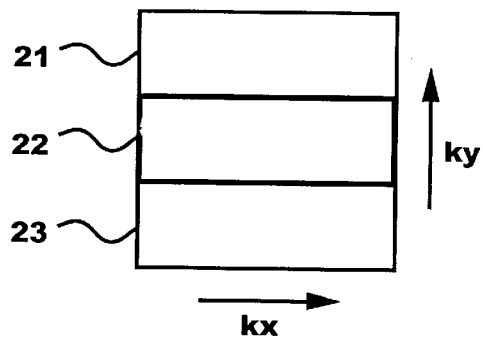
FIG. 2 is a view for explaining another embodiment to which an MRI method according to the present invention is applied.
Figure 2B:
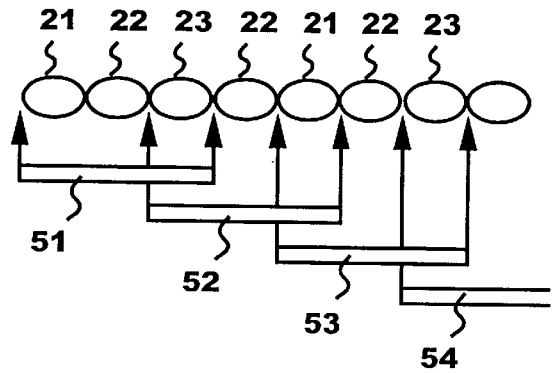

FIG. 2 illustrates such a measurement method in which, when pick-ups images by dividing k space, for example, into three regions 21, 22 and 23, measurement of the region 22 is repeated more frequently than the measurement of other regions, and for successively renewed images 51, 52 and 53, data of the region 22 are always replaced by newly measured data thereof. Namely, at first, data for regions 21, 22 and 23 are successively collected to reconstruct the image 51, in the subsequent data collection new data of regions 22 and 21 are successively collected to reconstruct the image 52 together with the data of the region 23 which was used immediately before for reconstructing the image 51. In subsequent data collection, new data of the regions 22 and 23 are successively collected to reconstruct the image 53 together with the data of the region 21 used immediately before for reconstructing the image 52. In this case, since the region which contributes most for variations of images in association with lapse of time is the low spatial frequency region, the low spatial frequency region is selected as the region 22 of which data are always renewed, thereby animating images having a desirable quality, of which temporal resolution of the reproduced images are scarcely deteriorated, can be obtained, even with a low apparent temporal resolution (2TR).

In this improved MR fluoroscopy, the generation and detection of a navigator echo is added for each of the measurements, and a navigator echo which is obtained, for example, in the earliest measurement is selected as a reference navigator echo for every image and the phases of the measurement data of other regions are corrected based on the reference navigator echo. Namely, for reconstruction of the image 51 the navigator echo obtained in the measurement of the region 21 is selected as the reference and the phases of measurement data of the other regions are corrected, and for the reconstruction of the image 52 the navigator echo obtained in the measurement of the region 23 is selected as the reference and the phases of the measurement data of other regions are corrected. In this instance, for example, the reference interval, in other words resolution of the phase correction is matched with the temporal resolution 2TR for the images. A navigator echo obtained in the earliest measurement of the necessary measurements for reconstructing one piece of image can be selected as the reference navigator echo as in the above embodiment. However, the present invention is not limited to the above embodiment, and, for example, the navigator echo obtained in the measurement of the region 22 of which measurement data are always renewed can be used as the reference navigator echo.

Further, when performing measurement for MR image pick-ups a prescanning sequence is frequently performed prior to a real measurement, for example, so as to adjust uniformity of the static magnetic field. In such instance, another navigator echo can be added in the prescanning sequence itself and of which added navigator echo can be also used as a reference navigator echo.

Further, in the present embodiment, an EPI sequence is exemplified as the standard sequence of the MR fluoroscopy. However, the standard sequence of the MR fluoroscopy is not limited to such sequence, and, in principle, any sequences, in which echo signals for reconstructing one piece of image are obtained by repeating shots of RF pulses, can be used. Examples of such sequences are, for example, burst imaging, hybrid burst imaging, gradient echo sequence, divided high speed gradient echo sequence, three dimensional (3D)-EPI, echo volume, spiral imaging, EPI type spectroscopy imaging and diffusion imaging.

Further, in the present embodiment a single navigator echo only in readout direction is introduced for every one shot of RF pulse. However, respective navigator echoes in readout direction and phase encoding direction can be introduced. Still further, an orbital navigator echo, which is generated by applying gradient magnetic fields of which phases are shifted by 90° in two crossing directions, can be used. Thereby, phase information of a plane formed by the two axes can be corrected.

Still further, in the present embodiment a navigator echo having a phase encoding amount of zero is used. However, in general, the phase encoding amount of the navigator echo is not limited to zero, if the phase encoding amount thereof is in a same condition.

Moreover, the present invention is not limited to the contents disclosed in connection with the embodiments, but can take several modifications in view of the gist of the present invention.

According to the present invention as has been explained above, when applying a navigation echo method to an MR fluoroscopy, a reference navigator echo is successively renewed for every one of images which constitute animating images, in the MRI method for animating images the positional information of the object to be inspected during the respective image pick-ups is reflected on respective images and a possible object motion of the object to be inspected is corrected based on the reflected positional information, thereby artifacts due to the object motion are reduced while keeping a high temporal resolution.

What is claimed is:

1. A magnetic resonance imaging method in which after irradiating RF pulses of magnetic resonance frequencies into an object to be inspected, a step of running a sequence for detecting echo signals sequentially and a step of reconstructing an image by making use of the detected echo signals which are repeated in parallel, and subsequent images are obtained by successively renewing a part of the echo signals used for reconstructing the previous image, characterized in that, a navigator echo is generated for every irradiation of the RF pulses and is detected, wherein one generated navigator echo which serves as a reference for correcting phases of the echo signals used for the image reconstruction and is successively renewed for every image, and phases of the echo signals are corrected based on the renewed navigator echo for every image.

2. A magnetic resonance imaging method according to claim 1, further comprising a step of forming an animating image from a plurality of successively reconstructed images.

3. A magnetic resonance imaging method comprising the steps of:

irradiating a RF pulse of magnetic resonance frequencies toward a predetermined slicing surface of an object to be inspected, and then detecting an echo signal group sequentially produced in association with the irradiation of the RF pulse;

reconstructing a piece of image of the predetermined slicing surface by making use of a plurality of echo signal groups which are acquired by repeating said echo signal group detecting step a plurality of times;

further reconstructing a subsequent piece of image of the predetermined slicing surface by making use of a part of the plurality of echo signal groups which is used for the previous image reconstruction and an echo signal group which is acquired by performing subsequently said echo signal group detecting step at least one time; and repeating said further step of reconstructing a subsequent piece of image while renewing a part of the plurality of echo signal groups used for the image reconstruction, wherein the magnetic resonance imaging method further comprises the steps of:

introducing in each of said echo signal group detecting steps at least one navigator echo for each of the echo signal groups;

role-assigning one of the respective navigator echoes introduced for a plurality of echo signal groups which are used for reconstructing a piece of image as a reference navigator echo exclusively for the reconstruction of the piece of image and the remaining navigator echoes as monitor navigator echoes;

determining phase differences between the reference navigator echo and the monitor navigator echoes which are assigned exclusively for the reconstruction of the piece of image and correcting the phases of echo signal groups to which the respective monitor navigator echoes belong based on the determined phase differences; and selecting for a successive image reconstruction a new reference navigator echo other than the navigator echo which is used as the reference navigator echo in the previous image reconstruction among respective navigator echoes for a plurality of echo signal groups which are used for the successive image reconstruction.

4. A magnetic resonance imaging method according to claim 3, further comprising a step of forming an animating image from a plurality of successively reconstructed images.

5. A magnetic resonance imaging method according to claim 3, wherein the navigator echoes introduced into said respective echo signal group detecting steps are introduced prior to the respective echo signal groups.

6. A magnetic resonance imaging method according to claim 3, wherein the navigator echoes introduced into said respective echo signal group detecting steps are introduced in readout direction with an encoding amount of zero.

7. A magnetic resonance imaging method according to claim 3, wherein the navigator echoes introduced into said respective echo signal group detecting steps include one in a readout direction and another in phase encoding direction respectively.

8. A magnetic resonance imaging method according to claim 3, wherein the navigator echoes introduced into said respective echo signal group detecting steps are an orbital navigator echo which is generated by applying two gradient magnetic fields in perpendicular directions having phases which are shifted by 90° with respect to one another.

9. A magnetic resonance imaging method according to claim 3, further comprising the steps of;

prescanning the predetermined slicing surface prior to said echo signal group detecting step for adjusting uniformity of the static magnetic field;

introducing at least one navigator echo into said prescanning step; and role-assigning the navigator echo introduced into said prescanning step as a reference navigator echo for said successive reconstruction step of the one piece of image.

10. A magnetic resonance imaging method according to claim 3, wherein among the navigator echoes belonging to the respective plurality of echo signal groups which are used for reconstructing one piece of image, one of the navigator echoes which belongs to an echo signal group generated from a specific region on the predetermined slicing surface is assigned as a reference navigator echo.

11. A magnetic resonance imaging method according to claim 10, wherein the specific region on the predetermined slicing surface is a low spatial frequency region.

12. A magnetic resonance imaging method according to claim 11, wherein the echo signal group generated from the specific region on the predetermined slicing surface is renewed for every reconstruction of one piece of image.

13. A magnetic resonance imaging device comprising:

means for repeatedly irradiating RF pulses of magnetic resonance frequencies at a predetermined interval onto an object to be inspected and placed in a static magnetic field;

means for applying gradient magnetic fields in the space of the static magnetic field surrounding the object to be inspected so as to acquire an echo signal group and at least one navigator echo from a predetermined region on a predetermined slicing surface of the object to be inspected in response the respective irradiation of the RF pulses from said RF pulse irradiation means;

means for detecting the echo signal groups and the navigator echoes belonging to the respective echo signal groups which are produced in response to the application of the gradient magnetic fields from said gradient magnetic field application means; and means for reconstructing one piece of image of the predetermined slicing surface by making use the plurality of echo signal groups acquired in said echo detecting means, wherein said image reconstructing means reconstruct a subsequent one piece of image of the predetermined slicing surface by making use of a part of the plurality of echo signal groups which are used for reconstructing a previous one piece of image and at least one echo signal group newly acquired from said echo detecting means, during the respective image reconstructions, one of the navigator echoes belonging to one of the plurality of echo signal groups which are used for each of the image reconstructions is assigned as a reference navigator echo, phase differences between the assigned reference navigator echo and other remaining navigator echoes are determined, the phases of the plurality of echo signal groups which are used for the image reconstruction are corrected based on the determined respective phase differences, and the reference navigator echo which is used for the phase correction of the respective plurality of echo signal groups is renewed for every image reconstruction.

14. A magnetic resonance imaging device according to claim 13 further comprising, means for forming an animating image from a plurality of images successively reconstructed and for displaying the animating image.

* * * * *